(12) United States Patent
Katoch

(10) Patent No.: US 9,824,780 B2
(45) Date of Patent: Nov. 21, 2017

(54) MEMORY DEVICE WITH REDUNDANT IO CIRCUIT

(71) Applicant: TAIWAN SEMICONDUCTOR MANUFACTURING CO., LTD., Hsinchu (TW)

(72) Inventor: Atul Katoch, Kanata (CA)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/076,416

(22) Filed: Mar. 21, 2016

(65) Prior Publication Data

US 2016/0293277 A1   Oct. 6, 2016

Related U.S. Application Data

(60) Provisional application No. 62/141,238, filed on Mar. 31, 2015.

(51) Int. Cl.
*G11C 29/00* (2006.01)
*G11C 29/44* (2006.01)

(52) U.S. Cl.
CPC .... *G11C 29/781* (2013.01); *G11C 2029/4402* (2013.01)

(58) Field of Classification Search
CPC .......... G11C 29/781; G11C 2029/4402; G11C 29/04; G11C 2213/71; G11C 29/785; G11C 8/18

USPC .......................................................... 365/200
See application file for complete search history.

(56) References Cited

U.S. PATENT DOCUMENTS

| | | | | |
|---|---|---|---|---|
| 4,975,881 A * | 12/1990 | Kagami | ................. | G11C 29/83 365/200 |
| 6,320,800 B1 * | 11/2001 | Saito | ........................ | G11C 8/06 365/189.05 |
| 2002/0114198 A1 * | 8/2002 | Kato | ....................... | G11C 29/26 365/200 |
| 2003/0177415 A1 * | 9/2003 | Togashi | ............. | G11C 29/4401 714/30 |
| 2011/0131446 A1 * | 6/2011 | Kinoshita | ............ | G11C 7/1006 365/200 |

* cited by examiner

*Primary Examiner* — Hoai V Ho
*Assistant Examiner* — Minh Dinh
(74) *Attorney, Agent, or Firm* — Maschoff Brennan

(57) ABSTRACT

A device includes input/output (IO) circuits, a redundant IO circuit and a redundant IO control unit. The input/output (IO) circuits coupled to a memory array. The redundant IO circuit is coupled to the memory array and the plurality of IO circuits. The redundant IO control unit is coupled to the IO circuits and the redundant IO circuit. In response to a failure column address signal, the redundant IO control unit configures the redundant IO circuit to substitute a failed IO circuit of the IO circuits. The redundant IO control unit includes a storage circuit, and during a shutdown mode, the storage circuit is configured to store the failure column address signal.

20 Claims, 5 Drawing Sheets

MEMORY DEVICE WITH REDUNDANT IO CIRCUIT

PRIORITY CLAIM AND CROSS-REFERENCE

This application claims priority to U.S. Provisional Application Ser. No. 62/141,238, filed Mar. 31, 2015, which is herein incorporated by reference.

BACKGROUND

Generally, semiconductor devices include memory devices. In the manufacture of memory devices, defects frequently exist. Such defects typically affect a number of memory elements in the memory devices. To prevent rejection of an entire chip due to the presence of the defective memory elements, semiconductor memory devices typically have some components for substituting or repairing the defective memory elements, in order to increase manufacturing process yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
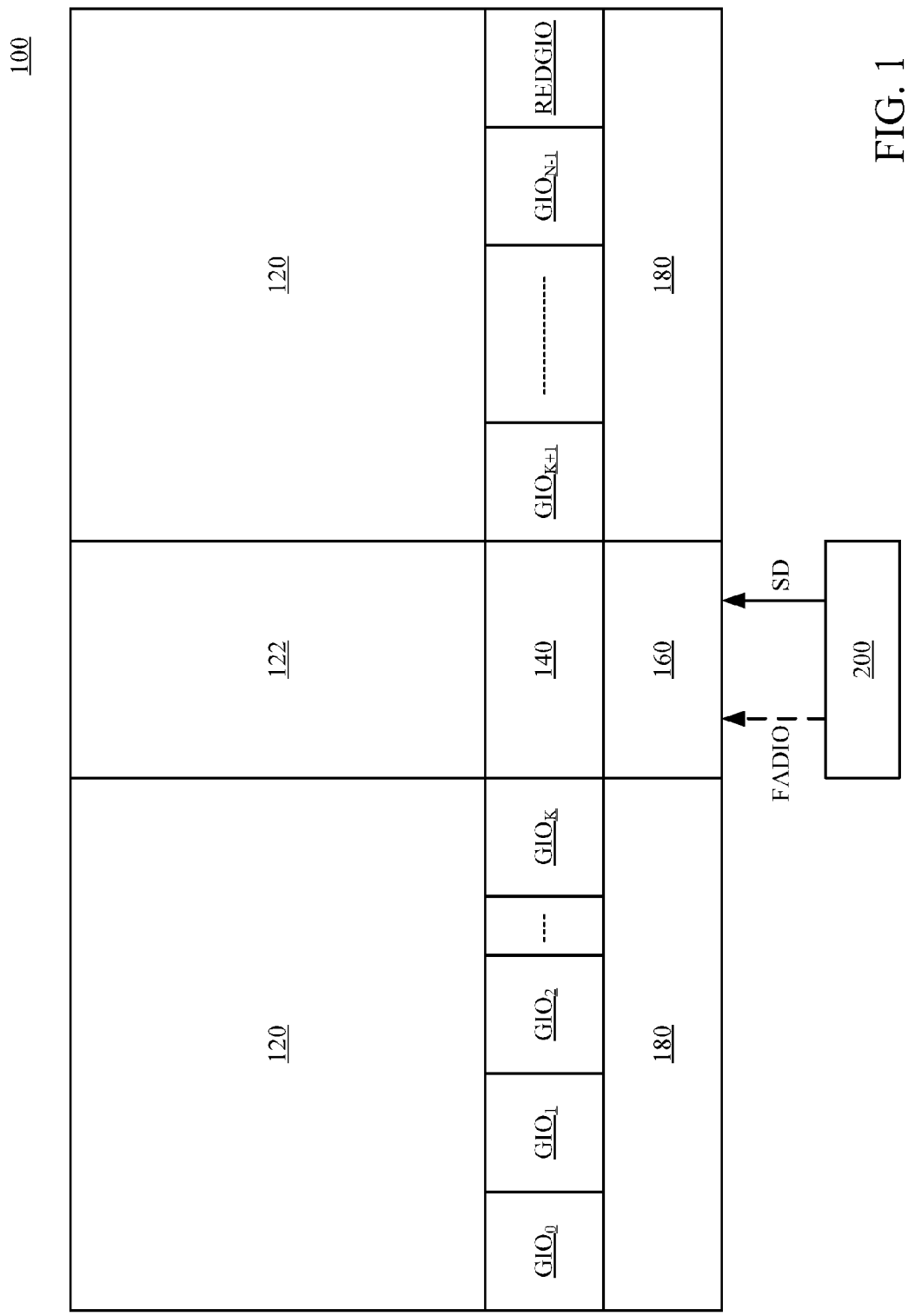
FIG. 1 is a schematic diagram illustrating a memory device according to some embodiments of the present disclosure.

FIG. 1 is a schematic diagram illustrating a memory device 100 according to some embodiments of the present disclosure. In some embodiments, the memory device 100 includes a memory array 120, a plurality of input/output (IO) circuits $GIO_0$-$GIO_{N-1}$, a redundant IO circuit REDGIO and a redundant IO control unit 160. For illustration, the redundant IO circuit REDIO shown in FIG. 1 is disposed next to the IO circuit $GIO_{N-1}$. The redundant IO circuit REDIO is configured to replace any failed IO circuit among the IO circuits $GIO_0$-$GIO_{N-1}$.

The number and/or the location of the redundant IO circuit REDIO are given for illustrative purposes. Various numbers and/or locations of the redundant IO circuit REDIO are within the contemplated scope of the present disclosure. For example, in various embodiments, an additional redundant IO circuit (not shown) is further disposed between the IO circuit $GIO_K$ and the IO circuit $GIO_{K+1}$. For illustration, the additional redundant IO circuit is configured to replace any failed IO circuit among the IO circuits $GIO_0$-$GIO_K$, and the redundant IO circuit REDIO is configured to replace any failed IO circuit among the IO circuits $GIO_{K+1}$-$GIO_{N-1}$. For another example, in some alternative embodiments, more than two redundant IO circuits are implemented in series with the IO circuits $GIO_0$-$GIO_{N-1}$.

In some embodiments, the memory array 120 includes a plurality of memory cell units, which, for convenience of illustration, are not shown in figures. The memory cell units are arranged, for illustration, in memory columns and memory rows. Accordingly, each of memory cell units is able to be accessed based on row address and column address.

In some embodiments, the IO circuits $GIO_0$-$GIO_{N-1}$ are associated with different memory columns and correspond to different column addresses. Explained in a different way, each of the IO circuits $GIO_0$-$GIO_{N-1}$ is associated with one of the memory columns and corresponds to a column address. For illustration, there are total N columns of the IO circuits $GIO_0$-$GIO_{N-1}$, and N is a positive integer. The IO circuit $GIO_0$ corresponds to a first memory column of the memory array 120 and the column address corresponding to the IO circuit $GIO_0$ is "0000000". The IO circuit $GIO_1$ corresponds to a second memory column of the memory array 120 and the column address corresponding to the IO circuits $GIO_1$ is "0000001." The IO circuit $GIO_2$ corresponds to a third memory column of the memory array 120 and the column address corresponding to the IO circuit $GIO_2$ is "0000010". The rest is deduced by analogy, and thus they are not further detailed herein.

The redundant IO circuit REDGIO is associated with a redundant memory column (not shown) in the memory array 120. If one of the IO circuits $GIO_0$-$GIO_{N-1}$ is failed, for example, when the IO circuit is disconnected from its memory column, or when the memory column connected to the IO circuit is not accessible, the redundant IO circuit REDGIO is configured to substitute or replace the failed IO circuit, as will be detailed below with reference to FIG. 2. After the failed IO circuit is replaced, the memory column originally connected with the failed IO circuit is accessible again. Accordingly, the function of the failed IO circuit is taken over by, for example, a next IO circuit, and a yield rate of the memory device 100 increases, compared to that of the memory device 100 without replacing the failed IO circuit. Alternatively stated, the memory device 100 is configured with column redundancy, for the failed IO circuit.

For illustration, there are total one hundred of IO circuits $GIO_0$-$GIO_{99}$, i.e., N=100. The column address corresponding to the IO circuit $GIO_{99}$ is, for example, "1100011." The column address of the redundant IO circuit REDGIO would be set to be, for example, "1100100," which is different from all column addresses of the IO circuits $GIO_0$-$GIO_{99}$.

In some embodiments, the column address of the failed IO circuit is recorded as a failure column address. In further embodiments, the failure column address is detected and/or identified during a testing procedure, or a packaging procedure, after the memory device 100 is manufactured. In some other embodiments, the failure column address is dynamically detected and/or identified by a monitoring system while the memory device 100 is operating.

The redundant IO circuit REDGIO is configured to be controlled by the redundant IO control unit 160. In some embodiments, the redundant IO control unit 160 receives a shutdown signal SD and a failure column address signal FADIO, and based on which, controls the redundant IO circuit REDGIO accordingly. For illustration, when the shutdown signal SD is set at a low level, a shutdown mode of the memory device 100 is deactivated. In contrast, when the shutdown signal SD is set at a high level, the shutdown mode of the memory device 100 is activated. The failure column address signal FADIO indicates a failure column address of the IO circuits $GIO_0$-$GIO_{N-1}$.

For convenience of illustration hereinafter, logic "0" indicates a low level, and logic "1" indicates a high level. The indications are given for illustrative purposes. Various indications are within the contemplated scope of the present disclosure.

In some embodiments, the failure column address signal FADIO and the shutdown signal SD are provided by an external source 200, including, for example, a memory driver (not shown) or a system processor (not shown) that is capable of accessing the memory device 100. According to the failure column address of a failed IO circuit of the IO circuits $GIO_0$-$GIO_{N-1}$, which is indicated by the failure column address signal FADIO, the redundant IO control unit 160 configures the redundant IO circuit REDGIO to substitute the failed IO circuit.

In some embodiments, the memory device 100 further includes a memory array controller 122, a global IO controller 140 and an address programming module 180. For illustration, the memory array controller 122 is configured to control and/or manage operations of the memory array 120. In some embodiments, the operations of the memory array 120 include, for example, a writing procedure, a reading procedure, an over-writing procedure and/or a data-erasing procedure of the memory cells. In some embodiments, the global IO controller 140 is configured to control and/or manage operations of the IO circuits $GIO_0$-$GIO_{N-1}$.

In some embodiment, the address programming module 180 is coupled to the IO circuits $GIO_0$-$GIO_{N-1}$, the redundant IO circuit REDGIO and the redundant IO control unit 160. In some embodiments, the redundant IO control unit 160 configures the redundant IO circuit REDGIO by adjusting a connection configuration of the address programming module 180. Details of adjusting the connection configuration of the address programming module 180 are discussed below with reference to FIG. 2.

In some embodiments, the memory device 100 has a shutdown mode. During the shutdown mode, some components and functions of the memory device 100 are turned off or suspended, to reduce leakage current and power consumption of the memory device 100. In some embodiments, the array controller 122 and the global IO controller 140 are able to be temporarily turned off during the shutdown mode.

Figure 2:
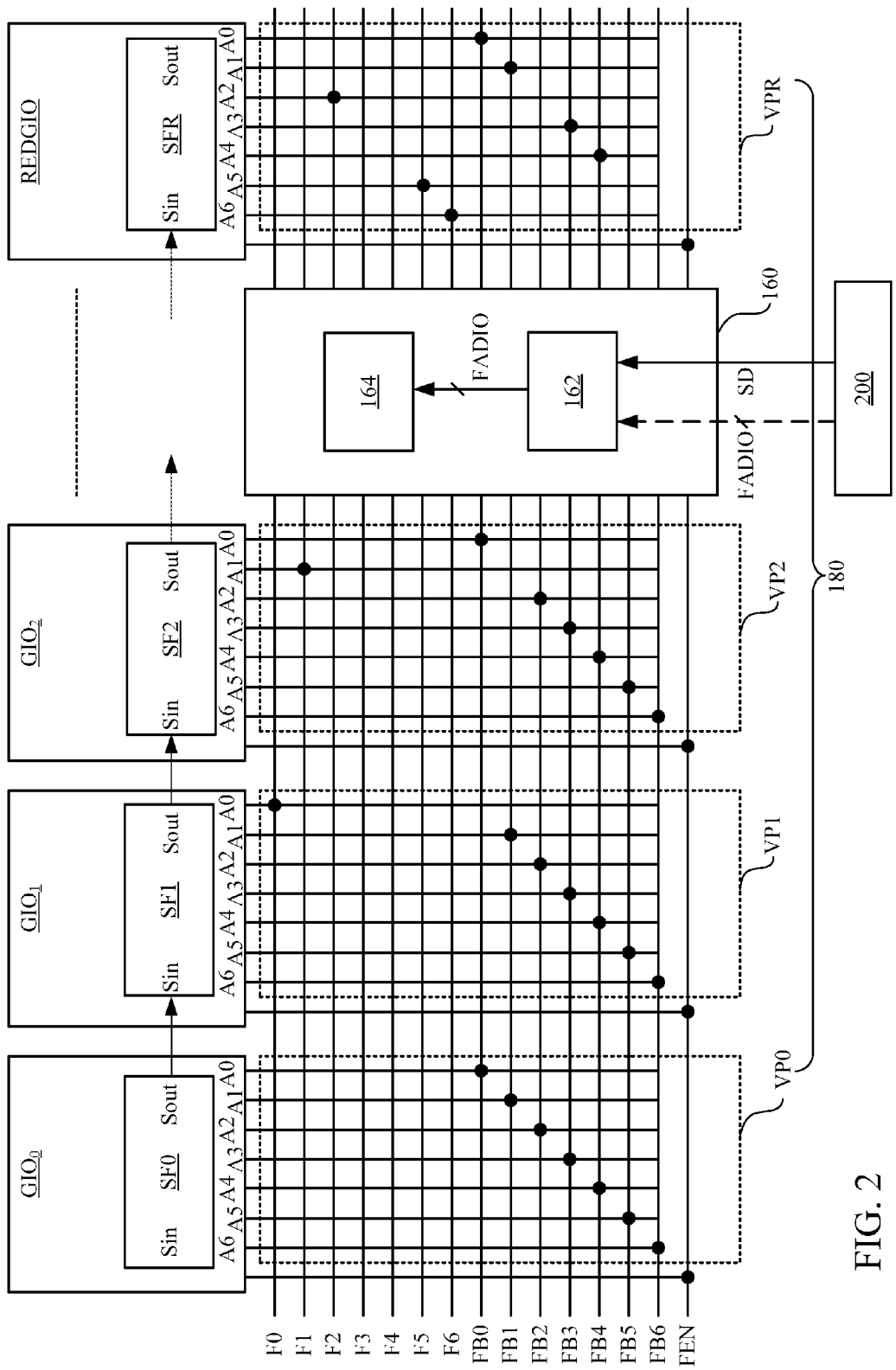
FIG. 2 is a schematic diagram illustrating a portion of components in the memory device in FIG. 1, according to some embodiments of the present disclosure.

Reference is made to FIG. 2. FIG. 2 is a schematic diagram illustrating the IO circuits $GIO_0$-$GIO_{N-1}$, the redundant IO circuit REDGIO, the redundant IO control unit 160 and the address programming module 180 of the memory device 100 in FIG. 1 according to some embodiments of the present disclosure. For convenience of illustration, the IO circuits $GIO_0$-$GIO_2$ are given in FIG. 2 for illustration, and the IO circuits $GIO_3$-$GIO_{N-1}$ are not shown in FIG. 2. Configurations and operations associated with the IO circuits $GIO_3$-$GIO_{N-1}$ are similar to, or correspond to, those associated with the IO circuits $GIO_0$-$GIO_2$, as will be discussed below, and thus they are not further detailed.

In some embodiments, the redundant IO control unit 160 includes a latch circuit 162 and a decoding circuit 164. For illustration, the latch circuit 162 receives the failure column address signal FADIO and the shutdown signal SD. When the shutdown signal SD is set to logic "0" indicating the shutdown mode being deactivated, the failure column address signal FADIO is received by the latch circuit 162, and the latch circuit 162 passes the failure column address signal FADIO to the decoding circuit 164. The decoding circuit 164 is configured to set up voltage levels of control address lines F0-F6 and reversed control address lines FB0-FB6 according to the failure column address signal FADIO from the latch circuit 162.

In some embodiments, the control address lines F0-F6 and the reversed control address lines FB0-FB6 have respective logics that are associated with the failure column address signal FADIO. For illustration, the failure column address signal FADIO is represented by "0000001." Accordingly, the control address lines F1-F6 are set at logic "0," and the control address line F0 is set at logic "1." The reversed control address lines FB0-FB6 are set at logics that are opposite to those of the control address lines F0-F6. Accordingly, the reversed control address lines FB1-FB6 are set at logic "1," and the reversed control address line FB0 is set at logic "0."

In some embodiments, during the shutdown mode, the external source 200 stops providing the failure column address signal FADIO to the redundant IO control unit 160. Alternatively stated, during the shutdown mode, the redundant IO control unit 160 does not receive the failure column address signal FADIO from the external source 200. The latch circuit 162 is configured to latch and keep the previously received failure column address signal FADIO during the shutdown mode. According to the latched failure column address signal FADIO, the decoding circuit 164 sets up voltage levels of the control address lines F0-F6 and the reversed control address lines FB0-FB6. In some other embodiments, the redundant IO control unit 160 includes other storage circuit, which replaces the latch circuit 162, for storing the failure column address signal FADIO.

The configuration of the redundant IO control unit 160 illustrated above is given for illustrative purposes. Various circuits and/or units to implement the redundant IO control unit 160 are within the contemplated scope of the present disclosure.

The number of the control address lines F0-F6, the reversed control address lines FB0-FB6, and digits (e.g., "0000001") representing the column addresses discussed above in FIG. 2 are given for illustrative purposes. Various numbers of control address lines, reversed control address lines and digits representing the column addresses are within the contemplated scope of the present disclosure.

When the shutdown signal SD is at logic "1" indicating the shutdown mode being activated, the latch circuit 162 is triggered to latch the previously received failure column address signal FADIO. In some embodiments, during the shutdown mode of the memory device 100, the external source 200, including, for example, the memory driver (not shown) or the system processor (not shown), will stop providing the failure column address signal FADIO to the redundant IO control unit 160. With the latch circuit 162 as discussed above, the failure column address signal FADIO is able to be kept in the redundant IO control unit 160 when the failure column address signal FADIO is not provided to the redundant IO control unit 160.

In some embodiments, the failure column address signal FADIO latched in the latch circuit 162 is provided to the decoding circuit 164. According to the latched failure column address signal FADIO, the decoding circuit 164 is able to set up voltage levels of the control address lines F1-F6 and the reversed control address lines FB0-FB6. As a result, the voltage levels of the control address lines F1-F6 and the reversed control address lines FB0-FB6 will not be lost or floated during the shutdown mode. Alternatively stated, the voltage levels of the control address lines F0-F6 and the reversed control address lines FB0-FB6 are maintained by the redundant IO control unit 160 during the shutdown mode.

In some embodiments, the address programming module 180 as illustrated in FIG. 2 includes address programming units VP0-VPR. For convenience of illustration, the address programming units corresponding to the IO circuits $GIO_3$-$GIO_{N-1}$ are not shown in FIG. 2, and the address programming units VP0-VP2 shown in FIG. 2 are given for illustration.

For illustration in FIG. 2, the address programming units VP0-VP2 are coupled to the IO circuits $GIO_0$-$GIO_2$ and the redundant IO control unit 160. Each one of the IO circuits $GIO_0$-$GIO_2$ is coupled to IO address lines A0-A6. According to the respective column addresses of the IO circuits $GIO_0$-$GIO_2$, each one of the address programming units VP0-VP2 connects the corresponding IO address lines A0-A6 with the corresponding control address lines, which are selected from the control address lines F0-F6 and the reversed control address lines FB0-FB6. For example in FIG. 2, the address programming unit VP0 connects the corresponding IO address lines A0-A6 to the reversed control address lines FB0, FB1, FB2, FB3, FB4, FB5 and FB6. The address programming unit VP1 connects the corresponding IO address lines A0-A6 to the control address line F0 and the reversed control address lines FB1, FB2, FB3, FB4, FB5 and FB6.

For illustration of the IO circuit $GIO_0$, when the column address is "0000000," the IO address lines A0-A6 are connected to the reversed control address lines FB0-FB6. For illustration of the IO circuit $GIO_1$, when the column address is "0000001," the IO address line A0 is connected to the control address line F0, and the IO address lines A1-A6 are connected to the reversed control address lines FB1-FB6. For illustration of the IO circuit $GIO_2$, when the column address is "0000010," the IO address line A1 is connected to the control address line F1, and the IO address lines A0 and A2-A6 are connected to the reversed control address lines FB0 and FB2-FB6.

The address programming unit VPR is coupled to the redundant IO circuit REDGIO and the redundant IO control unit 160. The redundant IO circuit REDGIO is coupled to IO address lines A0-A6. According to the column address of the redundant IO circuit REDGIO, the address programming unit VPR connects the IO address lines A0-A6 that are associated with the redundant IO circuit REDGIO, with the corresponding control address lines, which are selected from the control address lines F0-F6 and the reversed control address lines FB0-FB6. For example with reference to FIG. 2, when the column address is "1100100," the address programming unit VPR connects the IO address lines A0, A1, A3, A4 to the reversed control address lines FB0, FB1, FB3, FB4, and connects the IO address lines A2, A5, A6 to the control address lines F2, F5, F6.

In some embodiments, each one of the IO circuits $GIO_0$-$GIO_2$ and the redundant IO circuit REDGIO includes a shifter. For illustration, the IO circuit $GIO_0$ includes a shifter SF0, the IO circuit $GIO_1$ includes a shifter SF1, the IO circuit $GIO_2$ includes a shifter SF2, and the redundant IO circuit REDGIO includes a shifter SFR. The shifters SF0-SF2 are coupled in series, in some embodiments, according to an order of the column addresses of the IO circuits $GIO_0$-$GIO_2$. The shifter SFR is coupled in series to the shifter in the previous IO circuit, for example, the IO circuit $GIO_{N-1}$ (not shown).

For illustration in FIG. 2, each one of the shifters SF0-SF2 and SFR has a shift input Sin and a shift output Sout. The shift output Sout of the shifter SF0 is coupled to the shift input Sin of the shifter SF1. The shift output Sout of the shifter SF1 is coupled to the shift input Sin of the shifter SF2. The rest is deduced by analogy, and thus they are not further detailed herein.

In some embodiments, the shifters SF0-SF2 are configured to determine whether at least one of the IO circuits $GIO_0$-$GIO_2$ corresponds to the failure column address signal FADIO. In various embodiments, the shifters SF0-SF2 are configured to detect the voltage levels of the IO address lines A0-A6 associated therewith. Based on the detection result, whether at least one the IO circuits $GIO_0$-$GIO_2$ correspond to the failure column address signal FADIO is determined. For illustration, when all voltage levels of the IO address lines A0-A6 are at a high level detected by the shifter SF0, the shifter SF0 is then determined to correspond to the failure column address signal FADIO. This indicates that the IO circuit $GIO_0$ is failed.

As discussed above, the failure column address signal FADIO indicates the failure column address. According to the failure column address, a corresponding shifter of the shifters SF0-SF2 and SFR is configured to generate a hit signal at the shift output Sout.

For illustration, when the failure column address is "0000010," the shifter SF2 corresponds to the failure column address, which indicates that the IO circuit $GIO_2$ is failed. Accordingly, the shifter SF2 generates a hit signal, while the shifters SF0 and SF1 do not generate any hit signal. The shifter SF2 then passes the hit signal through the shift output Sout to an immediate next shift input Sin. Alternatively stated, the hit signal is then shifted through subsequent shifters, for example, of the IO circuits $GIO_3$-$GIO_{N-1}$ following the failed IO circuit $GIO_2$. In some embodiments, the hit signal is shifted until the hit signal reaches the shifter SFR of the redundant IO circuit REDGIO. The hit signal, generated at the shifter SF2, is shifted through the shifters of the IO circuits $GIO_3$-$GIO_{N-1}$ one by one to the shifter SFR. Accordingly, the shifters, subsequent to the shifter SF2, also generate the hit signal.

In one exemplary operation, if an access request is received to read/write at the failure column address "0000010," a next column at the column address "0000011" responds to the access request. In another exemplary operation, if another access request is received to read/write at the failure column address "0000011," a next column at the column address "0000100" responds to the access request.

Based on the above discussion, the failed IO circuit is skipped, while the IO circuit immediate next to the failed IO circuit is configured to operate for substituting the failed IO circuit. Consequently, the redundant IO circuit REDGIO is configured to operate as a backup for substituting the last presented IO circuit, for example, the IO circuit $GIO_{N-1}$.

As discussed above, the voltage levels of the control address lines F0-F6 and the reversed control address lines FB0-FB6 are maintained by the redundant IO control unit 160 during the shutdown mode. In some embodiments, the shifters SF0-SF2 and SFR remain activated during the shutdown mode. Accordingly, the shifter chain including the shifters SF0-SF2 and SFR is able to keep the hit signal during the shutdown mode. When the memory device 100 is resumed from the shutdown mode, the shifter chain does not require additional time to re-generate the hit signal. As a result, when the memory device 100 is resumed from the shutdown mode, the IO circuits including the IO circuits $GIO_0$-$GIO_2$ and the redundant IO circuit REDGIO are ready to perform a data accessing with column redundancy.

Figure 3:
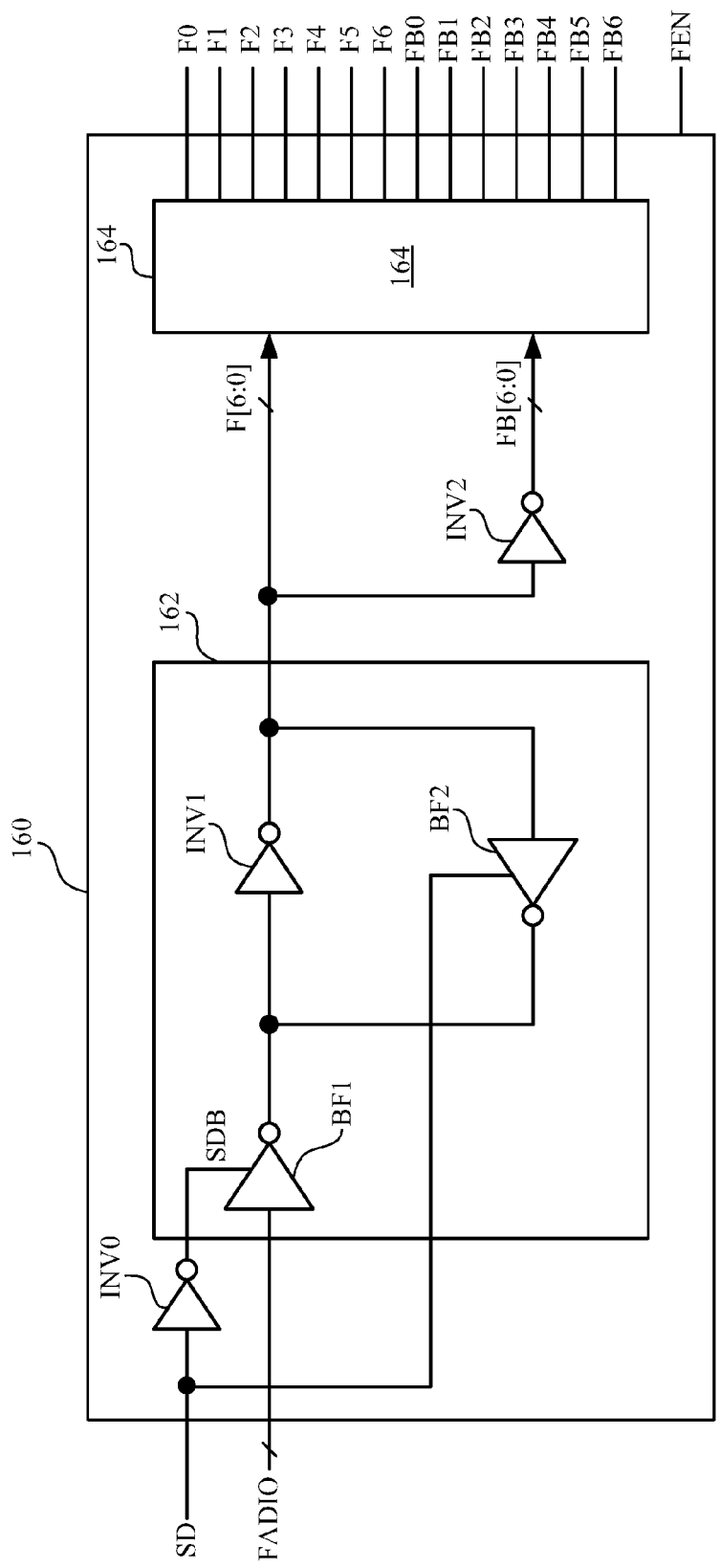
FIG. 3 is a schematic diagram illustrating a circuitry configuration of the redundant IO control unit in FIG. 2, according to some embodiments of the present disclosure.

Reference is made to FIG. 3. FIG. 3 is a schematic diagram illustrating a circuitry configuration of the redundant IO control unit 160 in FIG. 2, according to some embodiments of the disclosure.

For illustration in FIG. 3, the latch circuit 162 latches the failure column address signal FADIO during the shutdown mode. In some embodiments, the shutdown signal SD is set at logic "1" during the shutdown mode. In response to the shutdown signal SD of logic "1," the latch circuit 162 is triggered to latch the failure column address signal FADIO. When the shutdown signal SD transits to logic "0," the latch circuit 162 passes the failure column address signal FADIO to the decoding circuit 164 in response to the shutdown signal SD of logic "0."

In some embodiments, the failure column address signal FADIO is converted into an address word F[6:0] and a reversed address word FB[6:0] as illustrated in FIG. 3. Based on the address word F[6:0] and the reversed address word FB[6:0], the decoding circuit 164 sets up the voltage levels of control address lines F0-F6 and reversed control address lines FB0-FB6.

In some embodiments, the latch circuit 162 includes a tri-state inverting buffer BF1, an inverter INV1 and a tri-state inverting buffer BF2.

For illustration, the tri-state inverting buffer BF1 has an input end, an output end and a control end. The input end of the tri-state inverting buffer BF1 is configured to receive the failure column address signal FADIO. The control end of the tri-state inverting buffer BF1 is configured to receive a reversed shutdown signal SDB. In some embodiments, the redundant IO control unit 160 further includes an inverter INV0. The inverter INV0 is configured to invert the shutdown signal SD to generate the reversed shutdown signal SDB.

For illustration, the inverter INV1 has an input end and an output end. The input end of the inverter INV1 is coupled to the output end of the tri-state inverting buffer BF1.

In some embodiments, the tri-state inverting buffer BF2 has an input end, an output end and a control end. The input end of the tri-state inverting buffer BF2 is coupled to the output end of the inverter INV1. The output end of the tri-state inverting buffer BF2 is coupled to the input end of the inverter INV1. The control end of the tri-state inverting buffer BF2 is configured to receive the shutdown signal SD.

For illustration, when the shutdown mode of the memory device 100 is deactivated, the shutdown signal SD is set at logic "0" and the reversed shutdown signal SDB is set at logic "1." The tri-state inverting buffer BF1 is enabled by the reversed shutdown signal SDB. The tri-state inverting buffer BF2 is disabled by the shutdown signal SD. With the enabled tri-state inverting buffer BF1, the failure column address signal FADIO passes through the first tri-state inverting buffer BF1 and the inverter INV1. The address word F[6:0] corresponding to the failure column address signal FADIO is generated accordingly.

When the shutdown mode of the memory device 100 is activated, the shutdown signal SD is set to logic "1" and the reversed shutdown signal SDB is set to logic "0." The tri-state inverting buffer BF1 is disabled by the reversed shutdown signal SDB. The tri-state inverting buffer BF2 is enabled by the shutdown signal SD. Accordingly, the failure column address signal FADIO is latched by the tri-state inverting buffer BF2 and the inverter INV1. As a result, the failure column address signal FADIO is maintained in the latch circuit 162 during the shutdown mode of the memory device 100.

In some embodiments, the redundant IO control unit 160 further includes an inverter INV2. The inverter INV2 has an input that is coupled to the output of the inverter INV1, and an output that is coupled to the decoding circuit 164. The inverter INV2 is configured to invert the address word F[6:0] to generate the reversed address word FB[6:0].

The circuitry configuration of the redundant IO control unit 160 in FIG. 3 is given for illustrative purposes. Various configurations of the redundant IO control unit 160 are within the contemplated scope of the present disclosure. For example, in various embodiments, the redundant IO control unit 160 includes logical components to latch the failure column address signal FADIO in response to the shutdown signal SD of logic "0," which is opposite to what is discussed above.

Figure 4:
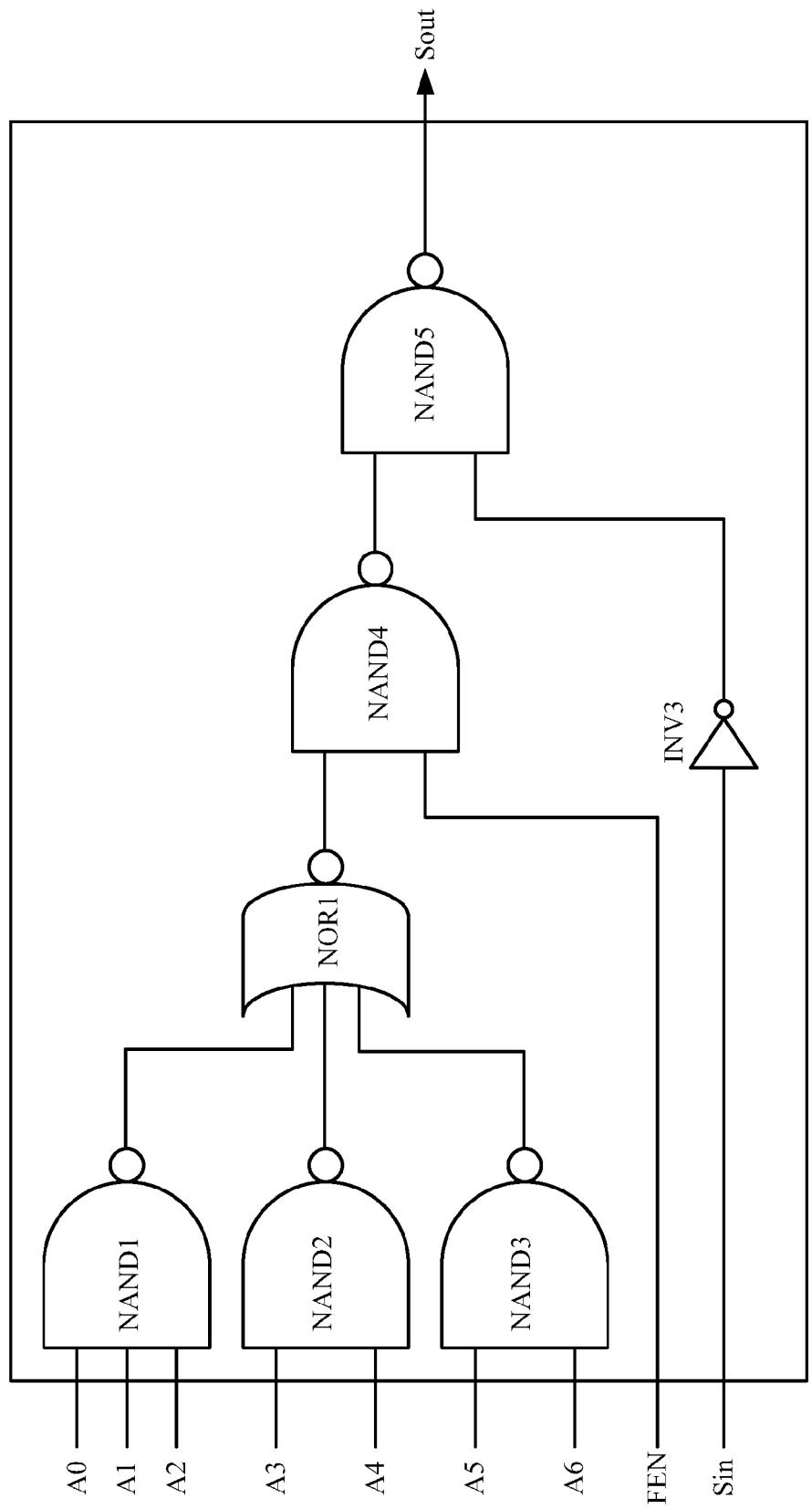
FIG. 4 is a schematic diagram illustrating a circuitry configuration of one of the shifters in FIG. 2, according to some embodiments of the disclosure.

Reference is made to FIG. 4. FIG. 4 is a schematic diagram illustrating a circuitry configuration of one of the shifters in FIG. 2, according to some embodiments of the present disclosure. In some embodiments, the circuitry configuration in FIG. 4 is applied in each one of the shifters as illustrated in FIG. 2.

In some embodiments, the shifter includes NAND gates NAND1, NAND2, NAND3, NAND4 and NAND5, a NOR gate NOR1 and an inverter INV3. For illustration, the NAND gate NAND1 is coupled to the IO address lines A0-A2, the NAND gate NAND2 is coupled to the IO address lines A3-A4, and the NAND gate NAND3 is coupled to the IO address lines A5-A6. Inputs of the NOR gate NOR1 are coupled to the outputs of the NAND gates NAND1, NAND2, NAND3. Inputs of the NAND gate NAND4 are coupled to the output of the NOR gate NOR1 and an enabling signal FEN which, in some embodiments, is generated by the redundant IO control unit 160. The input of the inverter INV3 is coupled to the shift input Sin. Inputs of the NAND gate NAND5 are coupled to the outputs of the NAND gate NAND4 and the inverter INV3. The output of the NAND gate NAND5 is coupled to the shift output Sout.

Based on the configurations as discussed above, the shift output Sout is set at logic "1" when the shift input Sin is set at logic "1." Moreover, the shift output Sout is also set at logic "1" when all of the IO address lines A0-A6 and the enabling signal FEN are set at logic "1." For illustration, when all of the IO address lines A0-A6 and the enabling signal FEN being set at logic "1," the present shifter corresponds to the failure column address signal FADIO, and the present shifter is able to generate the hit signal at the shift output Sout, as discussed above.

For another illustration, when the shift input Sin is set at logic "1," the immediate previous shifter corresponds to the failure column address signal FADIO. The present shifter is able to pass the hit signal to the immediate next shifter by setting the shift output Sout at logic "1."

The circuitry configuration of the shifter in FIG. 4 is given for illustrative purposes. Various configurations of the shifter are within the contemplated scope of the present disclosure.

Figure 5:
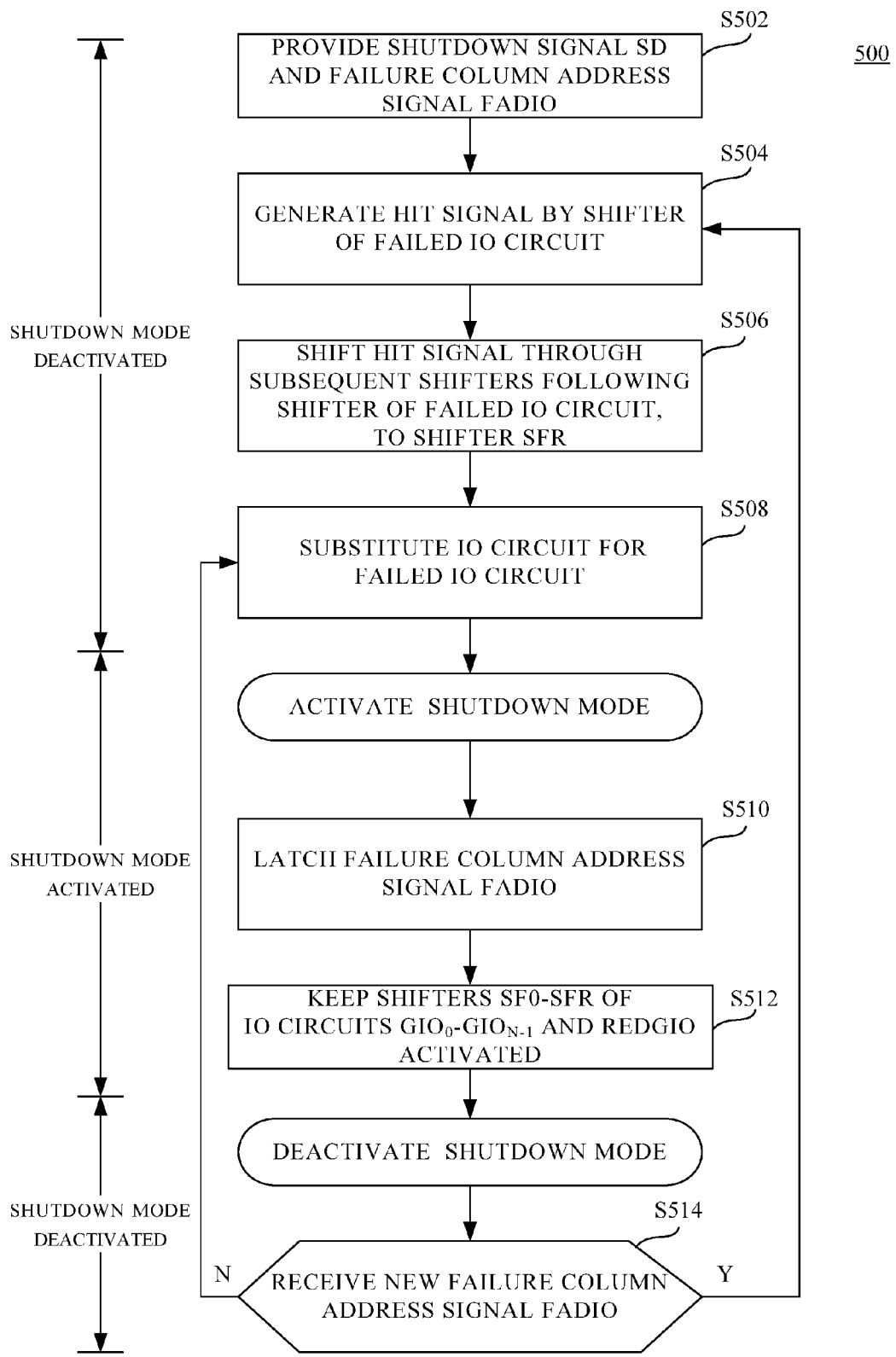
FIG. 5 is a flowchart diagram illustrating a method illustrating operations of the memory device in FIG. 1, according to some embodiments of the present disclosure.

FIG. 5 is a flowchart of a method 500 illustrating operations of the memory device 100 in FIG. 1, according to some embodiments of the present disclosure. The method 500 is given for illustration with reference to FIG. 1 and FIG. 2. Various memory devices in which the method 500 is able to be applied are within the contemplated scope of the present disclosure.

In operation S502, the shutdown signal SD and the failure column address signal FADIO are provided, for example, to the redundant IO control unit 160. The failure column address signal FADIO corresponds to a failed IO circuit of the IO circuits $GIO_0$-$GIO_{N-1}$. The failed IO circuit corresponds to one of the memory columns in the memory array 120.

In operation S504, a hit signal is generated by the shifter of the failed IO circuit corresponding to the failure column address signal FADIO.

In operation S506, the hit signal is shifted through subsequent shifters following the shifter of the failed IO circuit, to the shifter SFR of the redundant IO circuit REDGIO.

In operation S508, according to the failure column address signal FADIO, an IO circuit substitutes the failed IO circuit for accessing data of the memory column. In some embodiments, the IO circuit is immediate next to the failed IO circuit of the IO circuits $GIO_1$-$GIO_{N-1}$. For illustration, a first immediate next IO circuit substitutes the failed IO circuit, and responds to an access request to the failed IO circuit. A second immediate next IO circuit substitutes the first immediate next IO circuit, and responds to an access request to the first immediate next IO circuit, and so on. The redundant IO circuit REDGIO substitutes the last IO circuit, for example, $GIO_{N-1}$, and responds to an access request to the last IO circuit. Effectively, the redundant IO circuit REDGIO is configured to substitute the failed IO circuit.

In some embodiments, when the shutdown mode of the memory device 100 is activated, operation S510 is performed. In operation S510, the failure column address signal FADIO is latched, for example, by the latch circuit 162, according to the shutdown signal SD. In some other embodiments, the failure column address signal FADIO is stored by a storage circuit, for example, a register, a memory and/or a flash memory.

In operation S512, the shifters SF0-SFR of the IO circuits $GIO_0$-$GIO_{N-1}$ and the redundant IO circuit REDGIO are kept activated. Accordingly, the shifter chain including the shifters SF0-SFR is able to keep the hit signal during the shutdown mode. As a result, in some embodiments, when the memory device 100 is resumed from the shutdown mode, the method 500 is not required to repeat operation S504 and/or S506 for re-establishing the hit signal in the shifter chain.

In some embodiments, when the shutdown mode of the memory device 100 is deactivated, operation S514 is performed. In operation S514, it is determined whether a new failure column address signal FADIO which is different from the previously latched failure column address signal FADIO is received, for example, by the redundant IO control unit 160.

If a new failure column address signal FADIO is received by the redundant IO control unit 160, operation S504 is performed again, in which a hit signal corresponding to the new failure column address signal FADIO is generated accordingly. The operations subsequent to operation S504 are performed again accordingly.

If no new failure column address is received, operation S508 is performed again, in which the same IO circuit still substitutes the failed IO circuit. With the failure column address signal FADIO being latched by the latch circuit 162 and the shifters SF0-SFR are kept activated during the shutdown mode, the shifters SF0-SFR are able to keep the hit signal during the shutdown mode being activated. When the memory device 100 is resumed from the activated shutdown mode, the shifters SF0-SFR do not require additional time to re-generate the hit signal, and as a result, the IO circuits $GIO_0$-$GIO_{N-1}$ and the redundant IO circuit REDGIO are ready to perform data accessing.

In some embodiments, a device is disclosed that includes input/output (IO) circuits, a redundant IO circuit and a redundant IO control unit. The input/output (IO) circuits coupled to a memory array. The redundant IO circuit is coupled to the memory array and the plurality of IO circuits. The redundant IO control unit is coupled to the IO circuits and the redundant IO circuit. In response to a failure column address signal, the redundant IO control unit configures the redundant IO circuit to substitute a failed IO circuit of the IO circuits. The redundant IO control unit includes a storage circuit, and during a shutdown mode, the storage circuit is configured to storage the failure column address signal.

Also disclosed is method that includes the operations below. A failure column address signal is provided to a redundant IO control unit of a memory device. The failure column address signal corresponds to a failed IO circuit of the memory device. A shutdown signal for activating or deactivating a shutdown mode of the memory device is provided. During the activated shutdown mode, the failure column address signal is stored by a storage circuit of the redundant IO control unit in response to the shutdown signal.

A circuit including a redundant IO control unit is also disclosed. The redundant IO control unit is configured to control a redundant IO circuit in a memory device. In response to a failure column address signal, the redundant IO control unit is configured to substitute a failed IO circuit of a plurality of IO circuits in the memory device. The redundant IO control unit includes a storage circuit configured to store the failure column address signal during a shutdown mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a plurality of input/output (IO) circuits coupled to a memory array;
   a redundant IO circuit coupled to the memory array and the plurality of IO circuits; and
   a redundant IO control unit coupled to the IO circuits and the redundant IO circuit,
   wherein
   in response to a failure column address signal, the redundant IO control unit configures the redundant IO circuit to substitute a failed IO circuit of the IO circuits, and
   the redundant IO control unit comprises a storage circuit, and during a shutdown mode, the storage circuit is configured to store the failure column address signal.

2. The device of claim 1, wherein an IO circuit of the plurality of IO circuits is associated with a memory column in the memory array and corresponds to a column address.

3. The device of claim 1, wherein the redundant IO control unit further comprises:
   a decoding circuit configured to set up voltage levels of control address lines and reversed control address lines that are associated with the memory array, according to the failure column address signal.

4. The device of claim 1, further comprising:
   an address programming module comprising a plurality of address programming units, wherein each one of the IO circuits is connected with a plurality of IO address lines, the address programming units are configured to connect the plurality of IO address lines with control address lines and reversed control address lines according to column addresses of the plurality of IO circuits.

5. The device of claim 1, wherein during the shutdown mode, the redundant IO control unit is configured to set up voltage levels of control address lines and reversed control address lines, according to the failure column address signal stored by the storage circuit.

6. The device of claim 1, wherein a shifter of the failed IO circuit is configured to generate a hit signal in response to the failure column address signal.

7. The device of claim 6, wherein the plurality of IO circuits comprises shifters coupled in series, during the shutdown mode, the shifters of the plurality of IO circuits are activated.

8. The device of claim 1, wherein the storage circuit comprises:
   a first buffer having an input end, an output end and a control end, wherein the input end of the first buffer is configured to receive the failure column address signal, and the control end of the first buffer is configured to receive a first shutdown signal;
   a first inverter having an input end and an output end, wherein the input end of the first inverter is coupled to the output end of the first buffer; and
   a second buffer having an input end, an output end and a control end, wherein the input end of the second buffer is coupled to the output end of the first inverter, the output end of the second buffer is coupled to the input end of the first inverter, and the control end of the second buffer is configured to receive a second shutdown signal inverted from the first shutdown signal.

9. The device of claim 8, wherein when the shutdown mode is deactivated, the first buffer is enabled by the first shutdown signal, the failure column address signal passes through the first buffer and the first inverter, and the second buffer is disabled by the second shutdown signal.

10. The device of claim 8, wherein during the shutdown mode, the first buffer is disabled by the first shutdown signal, and the second buffer and the first inverter are configured to store the failure column address signal.

11. A method, comprising:
    providing a failure column address signal to a redundant IO control unit of a memory device, wherein the failure column address signal corresponds to a failed IO circuit of the memory device;
    providing a shutdown signal for activating or deactivating a shutdown mode of the memory device; and
    during the shutdown mode, storing the failure column address signal by a storage circuit of the redundant IO control unit in response to the shutdown signal.

12. The method of claim 11, wherein the memory device comprises a plurality of IO circuits and a redundant IO circuit, and the method further comprises:
    in response to the failure column address signal, substituting the redundant IO circuit for a failed IO circuit of the plurality of IO circuits.

13. The method of claim 12, wherein the plurality of IO circuits comprises shifters coupled in series, and the method further comprises:
    in response to the failure column address signal, generating a hit signal by a shifter of the failed IO circuit; and
    shifting the hit signal to the redundant IO circuit through the shifters of the IO circuits following the failed IO circuit.

14. The method of claim 13, further comprising:
    during the shutdown mode, keeping the shifters of the plurality of IO circuits activated.

15. A circuit, comprising:
    a redundant IO control unit configured to control a redundant IO circuit in a memory device, in response to a failure column address signal, to substitute a failed IO circuit of a plurality of IO circuits in the memory device;
    wherein the redundant IO control unit comprises a storage circuit configured to store the failure column address signal during a shutdown mode.

16. The circuit of claim 15, wherein the storage circuit comprises:
    a first buffer having an input end, an output end and a control end, wherein the input end of the first buffer is configured is receive the failure column address signal, the control end of the first buffer is configured to receive a first shutdown signal;

a first inverter having an input end and an output end, wherein the input end of the first inverter is coupled to the output end of the first buffer; and a second buffer having an input end, an output end and a control end, wherein the input end of the second buffer is coupled to the output end of the first inverter, the output end of the second buffer is coupled to the input end of the first inverter, the control end of the second buffer is coupled to a second shutdown signal opposite to the first shutdown signal.

17. The circuit of claim 16, wherein the first buffer and the second buffer are tri-state inverting buffers.

18. The circuit of claim 16, wherein when the shutdown mode is deactivated, the first buffer is enabled by the first shutdown signal, the failure column address signal passes through the first buffer and the first inverter, and the second buffer is disabled by the second shutdown signal.

19. The circuit of claim 16, wherein, during the shutdown mode, the first buffer is disabled by the first shutdown signal, the second buffer and the first inverter are configured to store the failure column address signal.

20. The circuit of claim 15, wherein a redundant IO control unit further comprises a decoding circuit configured to set up voltage levels of control address lines and reversed control address lines that are associated with a memory array, according to the failure column address signal.

* * * * *